United States Patent [19]
Ohata et al.

[11] Patent Number: 5,373,173
[45] Date of Patent: Dec. 13, 1994

[54] APPARATUS FOR SEMICONDUCTOR LASER

[75] Inventors: Toyoharu Ohata; Masamichi Ogawa; Kazuhiko Nemoto, all of Kanagawa; Yoshifumi Mori, Chiba, all of Japan

[73] Assignee: Sony Corporation, Tokyo, Japan

[21] Appl. No.: 62,209

[22] Filed: May 18, 1993

[30] Foreign Application Priority Data

May 20, 1992 [JP] Japan .................................. 4-127564
Aug. 28, 1992 [JP] Japan .................................. 4-230548
Sep. 22, 1992 [JP] Japan .................................. 4-253090

[51] Int. Cl.$^5$ .......................................... H01L 33/00
[52] U.S. Cl. .................................. 257/88; 257/93; 257/99; 257/627; 372/50
[58] Field of Search ................ 257/13, 88, 90, 91, 257/93, 94, 95, 96, 99, 594, 627, 628; 372/43, 44, 48, 49, 50

[56] References Cited
U.S. PATENT DOCUMENTS 4,719,635  1/1988  Yeh ........................................ 372/50
4,881,237 11/1989  Donnelly ............................. 372/50
5,012,477  4/1991  Mesquida et al. ................. 372/50

Primary Examiner—Sara W. Crane
Attorney, Agent, or Firm—Hill, Steadman & Simpson

[57] ABSTRACT

A light emitting element having a semiconductor substrate having {100} crystal surface as a major surface, a light emitting element formed on the semiconductor substrate, a growth blocking layer formed on a resonator end face of the light emitting element, a regrown layer formed on the light emitting element, a reflection mirror opposed to the resonator end face, a first electrode in contact with said semiconductor substrate, and a second electrode formed on the regrown layer, in which the regrown layer is made of the same material as that of the reflection mirror and the reflection mirror is formed of a semiconductor formed of {110} crystal surface epitaxially grown.

10 Claims, 15 Drawing Sheets

APPARATUS FOR SEMICONDUCTOR LASER

BACKGROUND OF THE INVENTION

1. Field of the Invention

The present invention relates to semiconductor laser devices and, more particularly, is directed to a so-called surface-emitting semiconductor laser device with emission directed perpendicular to the surface of a semiconductor substrate, for example.

2. Description of the Prior Art

A semiconductor laser device is realized widely as a light source for an optical disc, an optical fiber communication and so on. Further, the semiconductor laser device is made coherent and high in output and also monolithically integrated with a function device such as an optical modulator or the like. Recently, it is desired in view of application to parallel optical information processing or large capacity parallel light transmission or the like in an optical computer and so on that the semiconductor laser device is made as a two-dimensional integration of large scale. However, the merit test of a conventional semiconductor laser device can not be carried out if its elements are separated. Therefore, it is very difficult for the conventional semiconductor laser to be monolithically integrated.

For example, when a light emission end surface is formed by vertical etching process or the like, since a laser light is emitted in parallel to the surface of a substrate of the semiconductor laser device, it can not be made as a two-dimensional integration as it is. Further, there occurs a so-called diverge or the like in which the emitted light is shielded by or reflected on the surface of the substrate to cause interference or the like.

On the contrary, a surface-emitting type semiconductor laser device in which a laser light is emitted in the direction perpendicular to the surface of its substrate has been noted as a semiconductor laser device which can be two-dimensionally integrated. As such a surface-emitting type laser device, there is employed such a structure that, for example, a reflection mirror surface is provided with angles of 45° relative to the light-emitting surface of, for example, an ordinary semiconductor laser device and a laser light reflected on the reflection mirror surface is delivered in the direction perpendicular to the surface of its substrate. In order to make the surface-emitting type laser device as a monolithic structure, in general, by using an anisotropic dry etching process, for example, a semiconductor layer formed on a substrate is subjected to two anisotropic etching processes in the direction perpendicular to the substrate and in the inclined direction of about 45° relative to the substrate to thereby form a laser emitting surface and a reflection mirror surface and hence a surface-emitting laser device can be obtained.

There are such reports when, for example, semiconductor laser devices using InP system and GaAs system are formed, used are a mass transport (Z. Liau et. al Appl. Phys. Lett. 46 (1985) p. 115) method and an ion beam assisted etching (IBAE) method (T. H. Windhorn et. al Appl. Phys. Lett. 48 (1986) p. 1675), a chemical etching method (A. J. Spring Thorpe Appl. Phys. Lett. 31 (1977) p. 524) or a reaction ion beam etching (RIBE) method (T. Yuasa et. al CLEO '88wo6 4/27) and so on. According to these laser devices, as, for example, described in the report using the above IBAE method, they are high in threshold value and poor in output as compare with a laser device using a general cleavage plane.

That is, in these methods it is difficult that particularly a reflection mirror surface by an anisotropic etching process in an inclined direction is formed with a flatness in the order of atomic layer and the inclined angle is selected with high accuracy. Further, there are caused such problems that the emitting angle of light is deviated from the vertical direction and an aberration appears.

On the other hand, there is proposed a surface-emitting type laser device with a vertical resonator structure in which, for example, a reflection surface, a cladding layer, an active layer, cladding layer and a reflective surface are sequentially laminated on a substrate to form a resonator in the direction perpendicular to the substrate surface to thereby emit a laser light in the vertical direction. In the semiconductor laser of lamination structure, since the resonator is formed in the vertical direction, it is impossible that the cavity (gain area length) is selected large enough and hence at present it is impossible to obtain a sufficiently high output light. Thus, such the surface-emitting laser device is not practically realized.

Further, a multi-beam semiconductor laser device is used as a light source of a high speed and high definition laser printer or utilized as a 2-beam laser or 4-beam laser, which is shown in FIG. 1 or 2 in a schematic large scale perspective fashion, for parallel-writing on and parallel-reading from an optical disc, a magneto-optical disc or the like. In this case, as an optical system which processes a plurality of beams, generally used is a single optical system of simple structure similar to the optical system used in an ordinary single beam laser device, so that when the distance between the emitted beams is wide, there are caused a lens aberration and so on. Therefore, it is necessary that the distance between the laser beams is selected to be a narrow distance so as to cause no problem in that optical system. Also, in view of the matching property thereof with the pitch of tracks on a disc surface, the narrow distance between the beams is desired.

In the case of a semiconductor laser device, especially a high output semiconductor laser device used for a magneto-optical disc, when a beam distance becomes narrower, thermal interference between adjacent beams proposes a problem (for example, "Electronic Communicate on Society Technical Report (DQE88-6" by, for example, Tsunekane et. al). In order to avoid this thermal interference, it is necessary to widen the beam distance. At present, the beam distance is widened to its limit at which the optical system used can operate normally. In FIG. 1 or 2, a laser beam distance LO is selected to be about 50~100 $\mu$m.

OBJECTS AND SUMMARY OF THE INVENTION

Therefore, it is an object of the present invention to provide a light emission element free from the drawbacks encountered in the prior art.

It is another object of the present invention to provide a light emitting element which is superior in its surface flatness and in controlling of an angle as compared with the case where a reflection mirror surface is formed by the dry or wet etching such as the RIBE method, IBAE method or the like and which is wide in application and high in convenience because the element is formed under the growing condition same as that of an ordinary semiconductor laser device.

It is a further object of the present invention to provide a light emitting element which can be integrated in a 2-dimensional fashion since a number of semiconductor laser devices can be made without using a cleavage and also which can emit a light in the direction accurately perpendicular to the surface of a semiconductor substrate with no aberration and no diverge because an indined reflection mirror surface so as to emit a laser light in the vertical direction can be formed naturally by crystal growth.

It is a yet another object of the present invention to provide a light emission element which does not cause any thermal interference between resonators and in which a laser beam distance can be selected narrow.

According to an aspect of the present invention, there is provided a light emission element which comprises a semiconductor substrate having a {100} facet as a major surface, a light emitting element formed on the semiconductor substrate, a growth blocking layer formed on an end face of a resonator of the light emitting element, a regrown layer formed on the light emitting element, a reflecting mirror opposing the end face of the resonator, a first electrode in contact with the semiconductor substrate, and a second electrode formed on the regrown layer, wherein the regrown layer is made of the same material as that of the reflection mirror, and the reflection mirror is formed of a semiconductor having a {110} crystal facet and expitaxially grown.

According to another aspect of the present invention, there is provided a light emission element which comprises a semiconductor substrate having a {100} facet as a major surface, a light emitting element formed on the semiconductor substrate and having a plurality of resonators whose directions are parallel to a <001> direction, a reflection mirror opposing the end face of the resonator, a first electrode in contact with the semiconductor substrate, and a second electrode formed on the light emitting element, wherein the reflection mirror is formed of a semiconductor having a {110} crystal facet and epitaxially grown.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIGS. 28A through 28K are schematic diagrams used to explain an example of the application of a 2-beam laser, respectively.

DETAILED DESCRIPTION OF THE PREFERRED EMBODIMENTS

Embodiments of the semiconductor laser device according to the present invention will hereinafter be described with reference to the drawings attached.

A first embodiment of the semiconductor laser device according to the present invention will now be described with reference to FIG. 3 in association with the manufacturing method thereof in order to understand this semiconductor laser device more easily. According to this embodiment, after a current blocking layer was formed on an active layer through a cladding layer, the current blocking layer is etched away at its portion near a waveguide region, thereby forming a so-called SAN (self-aligned narrow stripe) structure in which an effective refractive index near the waveguide region is increased and a current striction and a light confinement are carried out simultaneously.

Figure 3:
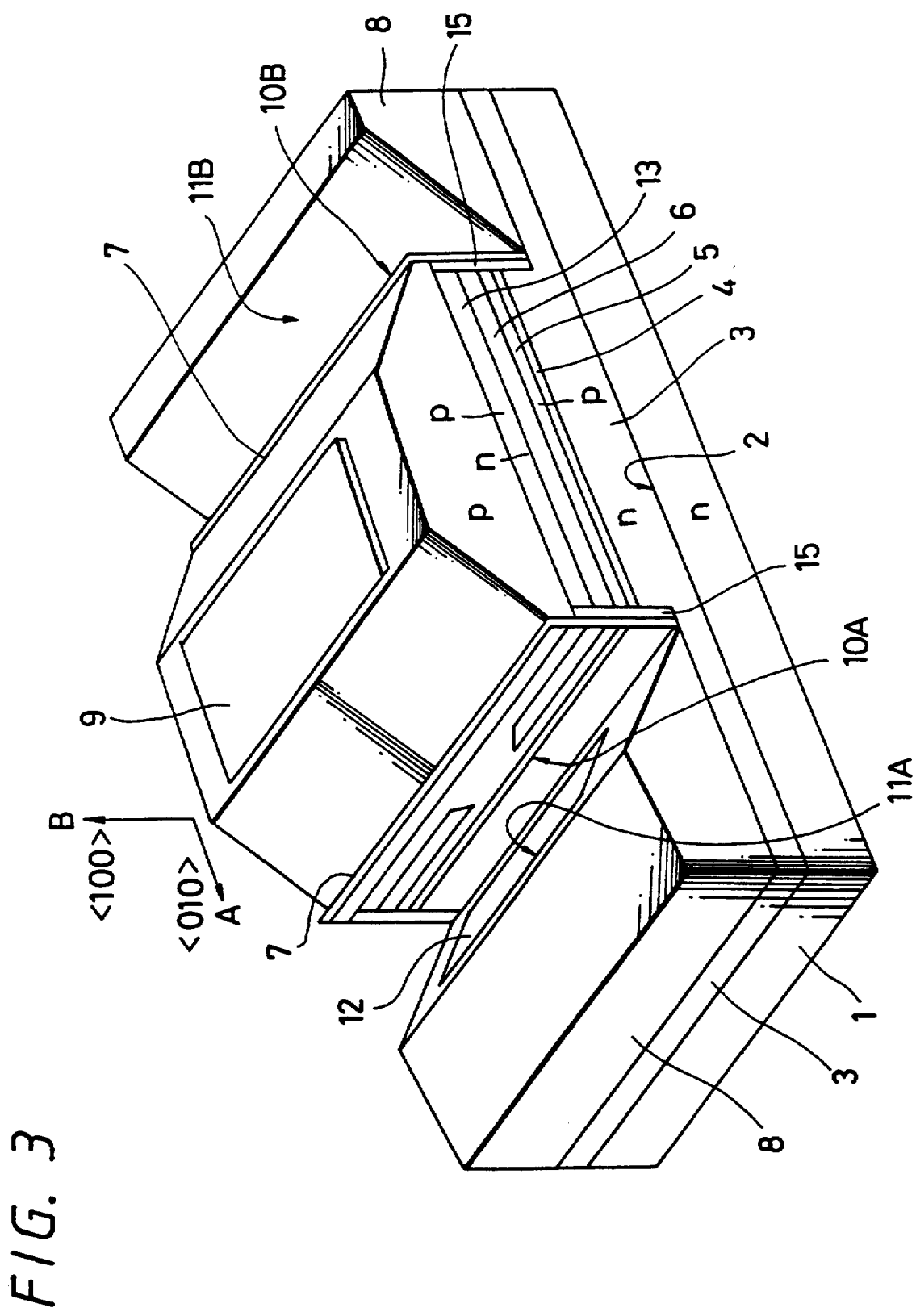
FIG. 3 is a perspective view illustrative of an embodiment of a semiconductor laser device according to the present invention.

As shown in FIG. 3, there is provided a GaAs semiconductor substrate 1 of a first conductivity type, for example, n-type which has a major surface 2 formed of a {100} crystal facet, e.g., (100) crystal facet or cleage plane. This semiconductor laser further includes a AlGaAs cladding layer 3 of a first conductivity type e.g. n-type, and made of, for example, AlGaAs, an active layer 4 made of, for example, intrinsic GaAs, a cladding layer 5 made of, for example, AlGaAs and of a second conductivity type e.g., p-type, a current blocking layer 6 of the first conductivity type e.g., n-type and made of e.g., GaAs, a growth blocking layer made of SiNX or the like, a regrown layer 8 of second conductivity type made of GaAs of p-type formed by a regrowth process and which is grown at an angle of 45° relative to the major surface 2 of the semiconductor substrate 1 and an electrode 9 in contact with the regrown layer 8 in an ohmic-contact fashion. Resonator end faces 10A and 10B are formed by a vertical etching process such as an RIE (reactive ion etching) process or the like so that a resonator is extended in a <010> crystal axis direction shown by an arrow A in FIG. 3, e.g., [010] crystal axis direction. Crystal grown planes formed of {110} crystal facets. e.g., (110) crystal facets opposing the above and which are formed at an angle of 45° relative to the major surface 2 of the substrate 1 are formed as reflection mirror surfaces 11A, 11B, respectively. A high reflection film 12 made of a metal or dielectric multifilm is deposited on one reflection mirror surface 11A.

An example of manufacturing processes of the above-mentioned semiconductor laser device will be described with reference to FIGS. 4 to 9.

Figure 4:
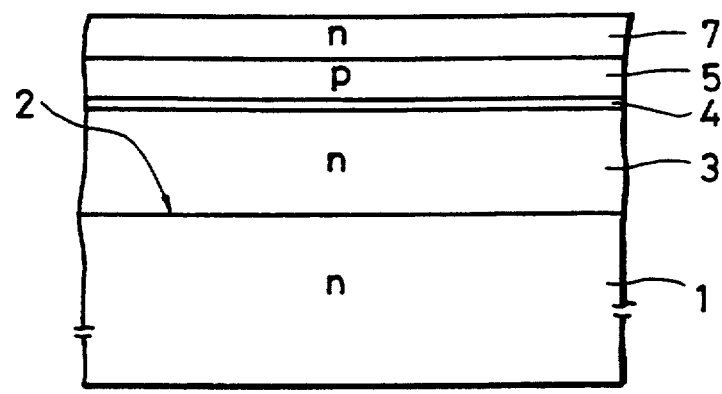
FIGS. 4 through 9 are manufacturing process diagrams of the embodiment of the semiconductor laser device according to the present invention, respectively.

As shown in FIG. 4, a semiconductor substrate 1 made of first conductivity type, in this case, n-type GaAs or the like is prepared. Then, on a major surface 2 formed of the {100} crystal facet of the substrate 1, there are sequentially grown the first conductivity type cladding layer 3 made of n-type AlGaAs or the like, the active layer 4 made of intrinsic GaAs or the like, the second conductivity type cladding layer 5 made of p-type AlGaAs or the like and the current blocking layer 7 made of n-type AlGaAs or the like by, for example, a MOCVD (metal organic chemical vapor deposition) method or the like.

Figure 5:
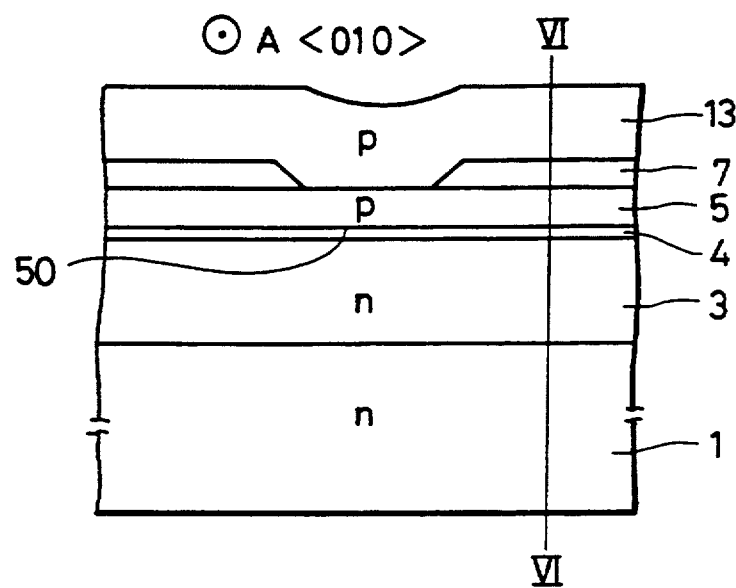

Then, a photoresist mask (not shown) is formed on an upper portion of a portion which will serve as a waveguide region 50. As shown in FIG. 5, a part of the current blocking layer 7 is removed by some suitable processes such as a wet etching or the like. The etched away portion of the current blocking layer 7 is treated by a patterning process as a pattern which is extended in the <010> crystal axis direction, i.e., in the direction perpendicular to the sheet of drawing as shown by an arrow A in FIG. 5. The second cladding layer 13 of second conductivity type made of e.g., p-type AlGaAs is epitaxially grown on the whole surface similarly by the MOCVD method or the like so as to cover the etched away portion. Thus, a current structure is carried out on the portion where the current blocking layer 7 is removed and a refractive index at the nearby region is increased as compared with those of other portions, thereby the light confinement being effected.

Figure 6:
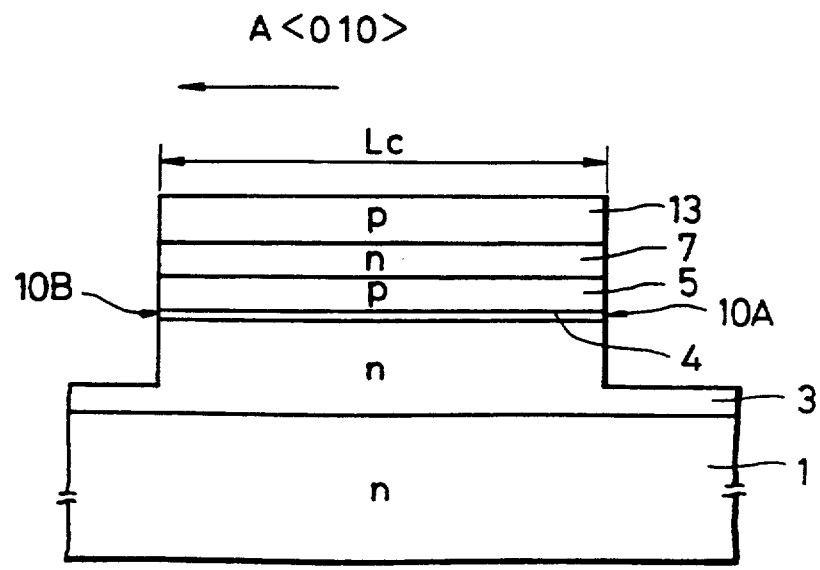

FIG. 6 is a cross-sectional view taken along the line VI to VI in FIG. 5. As shown in FIG. 6, the product is etched by a vertical etching perpendicular to the major surface 2 of the substrate 1 with a predetermined resonator length Lc according to the anisotropy etching process such as an RIE or the like so that the etching reaches the substrate 1 in depth, thereby forming a resonator which is extended in the <010> crystal axis direction as shown by an arrow A in FIG. 6. In FIG. 6, reference numerals 10A and 10B designate resonator end faces that are formed by the vertical etching process.

Figure 7:
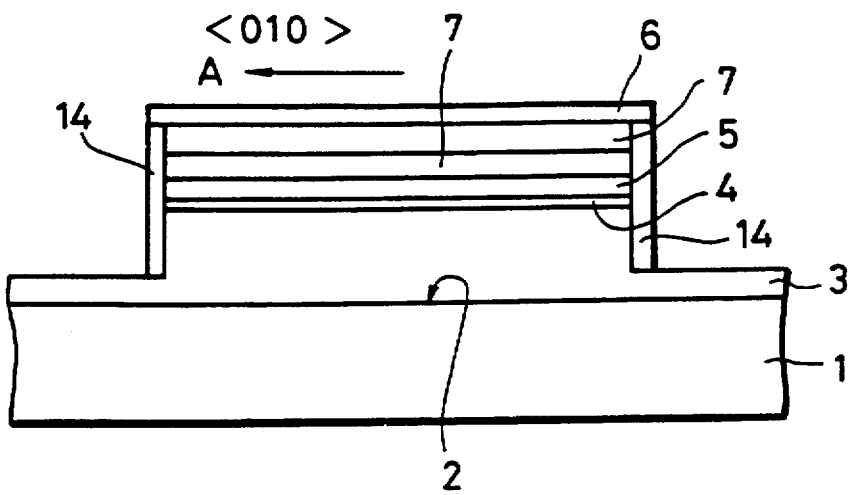

Then, after a protecting material film made of material such as SiNX or the like was deposited on the whole surface, the whole surface is etched by the vertical etching process such as the RIE or the like thereby to remove the protecting material on the second cladding layer 13 of second conductivity type and the major surface 2 of the substrate 1 to leave only side wall portions, whereby a protecting film 14 on the resonator end faces 10A, 10B being deposited as shown in FIG. 7. Further, a material layer made of p-type GaAs or the like is deposited on the protecting film 14 and the cladding layer 5 of second conductivity type and then a cap layer 6 is deposited by the application of photolithography technique.

Figure 8:
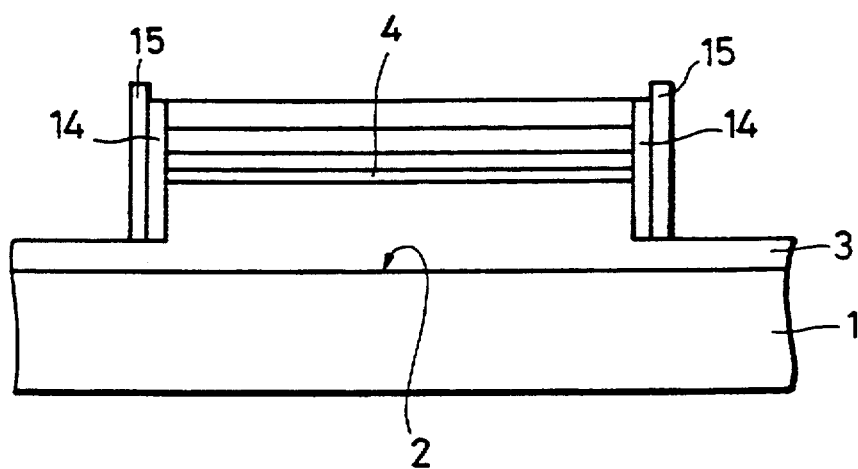

After a dielectric layer such as SiO2, Si3N4 or the like is deposited on the whole surface by a plasma chemical deposition method or the like to cover the latter, the anisotropy etching such as the RIE or the like is carried out in the direction perpendicular to the major surface 2 of the substrate 1 to leave only the side wall portions, thereby forming a growth blocking layer 15 so that the growth blocking layer 15 covers the resonator end faces 10A, 10B and the protecting film 14 formed on the resonator end faces 10A, 10B. Then, as shown in FIG. 8, the cap layer 6 on the cladding layer 5 of second conductivity type is removed by a selective etching process.

Figure 9:
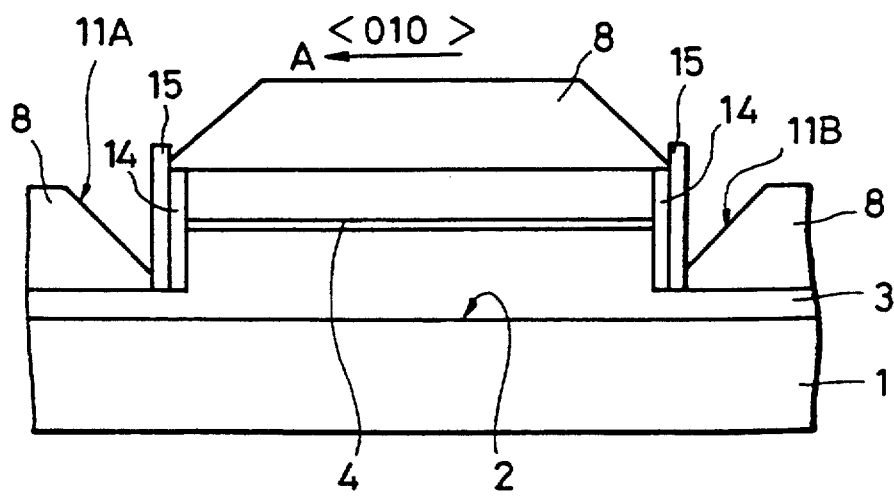

Thereafter, by the MOCVD method, MBE (molecula beam epitaxy) method or a normal pressure MOCVD method such as a reduced pressure MOCVD method or the like, under the normal growth condition, i.e., a growth temperature is higher than 780° C. and V/III ratio (ratio of atomic numbers of V-group element and III-group element) is larger than 20, the regrown layer 8 of second conductivity type made of p-type GaAs is epitaxially grown so that, as shown in FIG. 9, the reflection mirror surfaces 11A and 11B formed of {110} crystal facets forming an angle of substantially 45° relative to the major surface 2 of the substrate 1 are formed in an opposing relation to the resonator end faces 10A and 10B formed by the vertical etching process. The reflection mirror surfaces 11A, 11B are spontaneously formed by properly selecting the major surface 2 of the substrate 1 and the resonator length direction because a growing speed is extremely low on the {110} crystal surface. Assuming that the leftward resonator length direction shown by an arrow A in FIG. 9 is the [010] crystal axis direction, then the reflection mirror surface 11A becomes (1-10) crystal surface and the reflection mirror surface 11B becomes (110) crystal surface.

As described above, according to the present invention, since the reflection mirror surfaces 11A and 11B are served as the crystal grown surfaces, the planarity of the surface thereof and the angle can be controlled considerably satisfactorily as compared with the prior art. Further, in this case, without the method such as very high temperature diffusion or the like in which a crystal growth surface is relatively difficult to be grown, the crystal growth surface can be formed under the growth condition such as the temperature condition, the V/III ratio or the like which are similar to those of the ordinary semiconductor laser. Therefore, the semiconductor laser device of this embodiment becomes very advantageous from a general-purpose and handiness standpoint.

Then, as shown in FIG. 3, the electrode 9 that is brought in ohmic contact with the upper surface of the regrown layer 8 on the active layer 4 and the rear surface (not shown) of the substrate 1 is deposited and the high reflection film 12 made of dielectic material or the like is deposited on, for example, one reflection mirror surface 11A, thereby obtaining a semiconductor laser device of the present invention.

Further, according to the present invention, since the regrown layer 8 is made of the material having the same conductivity as that of the cladding layer 5 of second conductivity type, the thickness of the layer of the second conductivity type can be increased sufficiently. Therefore, a contact resistance with the electrode can be reduced and the active layer can be suppressed from being damaged by a distortion.

When the laser device is actuated by a current, a resonator is formed between the two vertical end faces 10A and 10B to cause a laser oscillation so that a light temporarily emitted in parallel to the major surface 2 of the substrate 1 is reflected by the reflection surfaces 11A, 11B provided at an angle of 45° in the direction perpendicular to the substrate 1, thereby realizing a surface emission.

Since the semiconductor laser device is formed as the SAN type, the light confinement in the lateral direction can be effected together with the current striction, thereby obtaining a surface-emission laser device whose its threshold value can be lowered.

Figure 10:
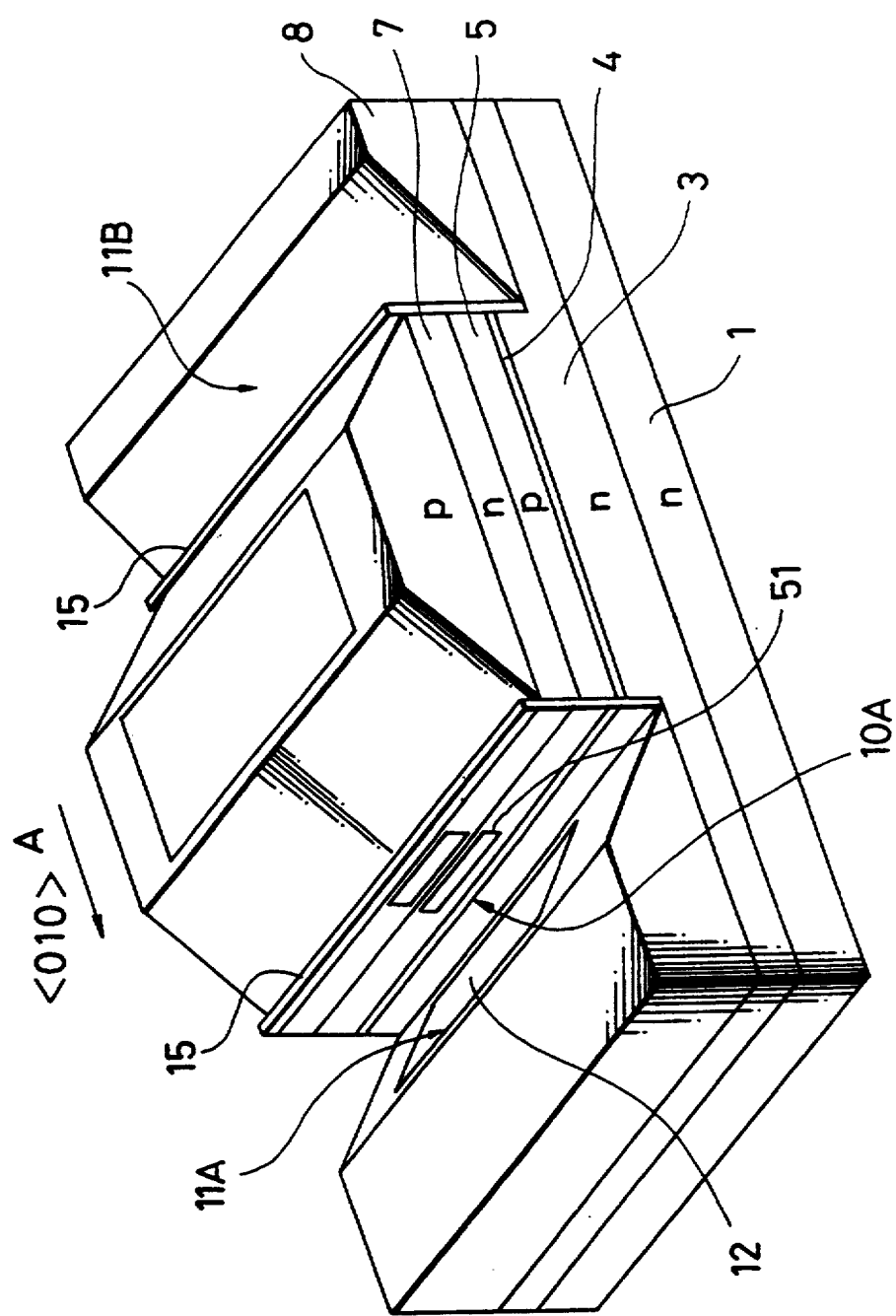
FIG. 10 is a perspective view illustrative of a second embodiment of the semiconductor laser device according to the present invention.

While the present invention is explained about the SAN type semiconductor laser device as described above, the present invention is not limited thereto and can be applied to a semiconductor laser device of a so-called Rib type in which a cladding layer 5 of second conductivity type, the current blocking layer 7 or the like are sequentially deposited on a stripe-shaped guide layer 51 that is formed on the active layer 4 so as to be extended in the resonator length direction as shown in FIG. 10. In FIG. 10, like parts corresponding to those of FIG. 3 are marked with the same references and therefore need not be described in detail. Also in this case, it is possible to obtain the surface-emission laser device whose threshold value is lowered.

Figure 11:
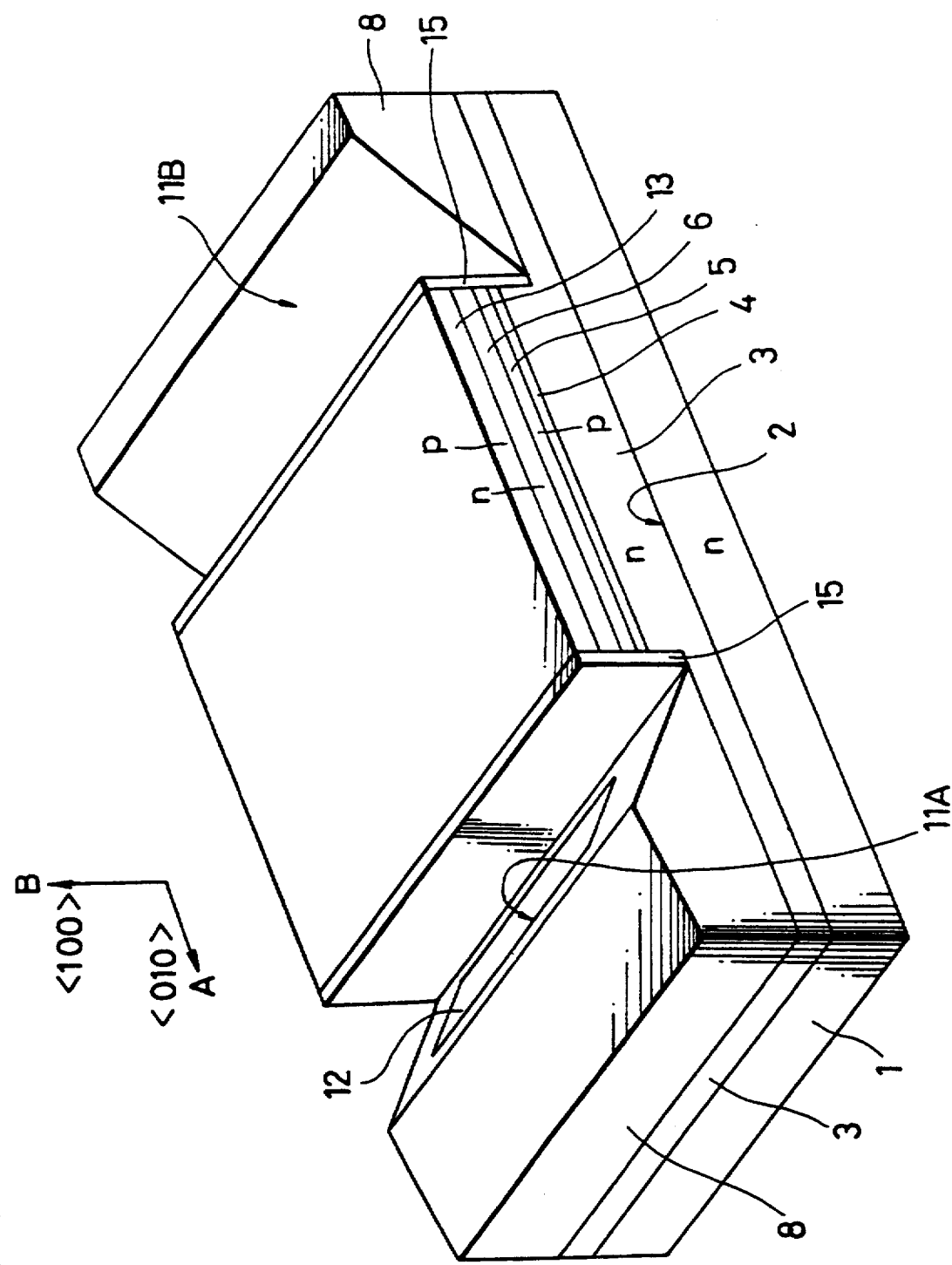
FIG. 11 is a perspective view illustrative of a third embodiment of the semiconductor laser device according to the present invention.

Alternatively, the semiconductor laser device may be modified such that a growth blocking layer 15 is deposited on the cladding layer of second conductivity type and the resonator end face, whereby the regrown layer is formed only at the position in which the reflection mirror is formed, as shown in FIG. 11.

Figure 12:
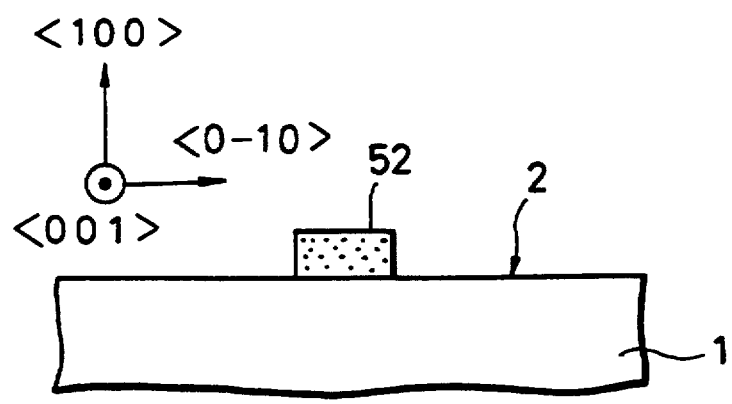
FIGS. 12 and 13 are schematic diagrams used to explain the condition that a reflection mirror surface is grown, respectively.
Figure 13:
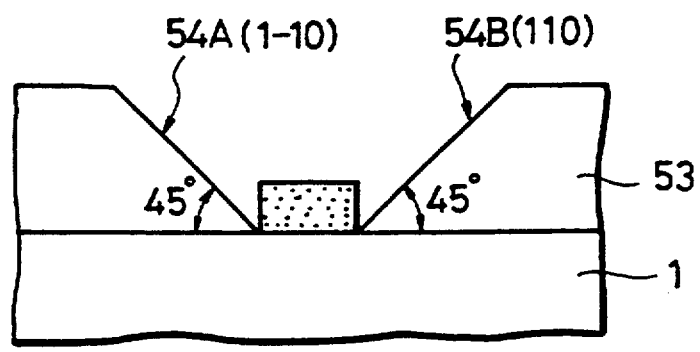

Further, as shown in FIG. 12, if a semiconductor layer 53 such as GaAs, AlGaAs, InP, InAlGaP or the like is crystally grown by the MOCVD method, the MBE method or the pressure reduced MOCVD method or the like after a resist layer 52 extended in the <001> crystal axis direction was formed on the major surface 2 formed of {100} crystal facets of the semiconductor substrate 1 by a pattern exposure process or the like, a {110} crystal facet is temporarily produced from the end portion of the resist layer 52 spontaneously. The growing speed on the {110} crystal facet is relatively slow so that, as shown in FIG. 13, there is formed a {110} crystal facet which is extended from the edge portion of the resist layer 52 at an angle of 45° relative to the major surface 2. As a result of consideration and study done by the assignee of the present application, it becomes clear that if a ridge, a groove, an opening portion covered with a mask or the like is formed as a pattern that is extended in the <001> crystal axis direction similarly to the above-mentioned resist 52 instead of the resist, then an inclined surface 54A formed of the {110} crystal surface which is formed at an angle of 45° relative to the major surface 2, e.g., (1-10) surface and an inclined surface 54B formed of (110) surface are spontaneously formed.

Figure 14:
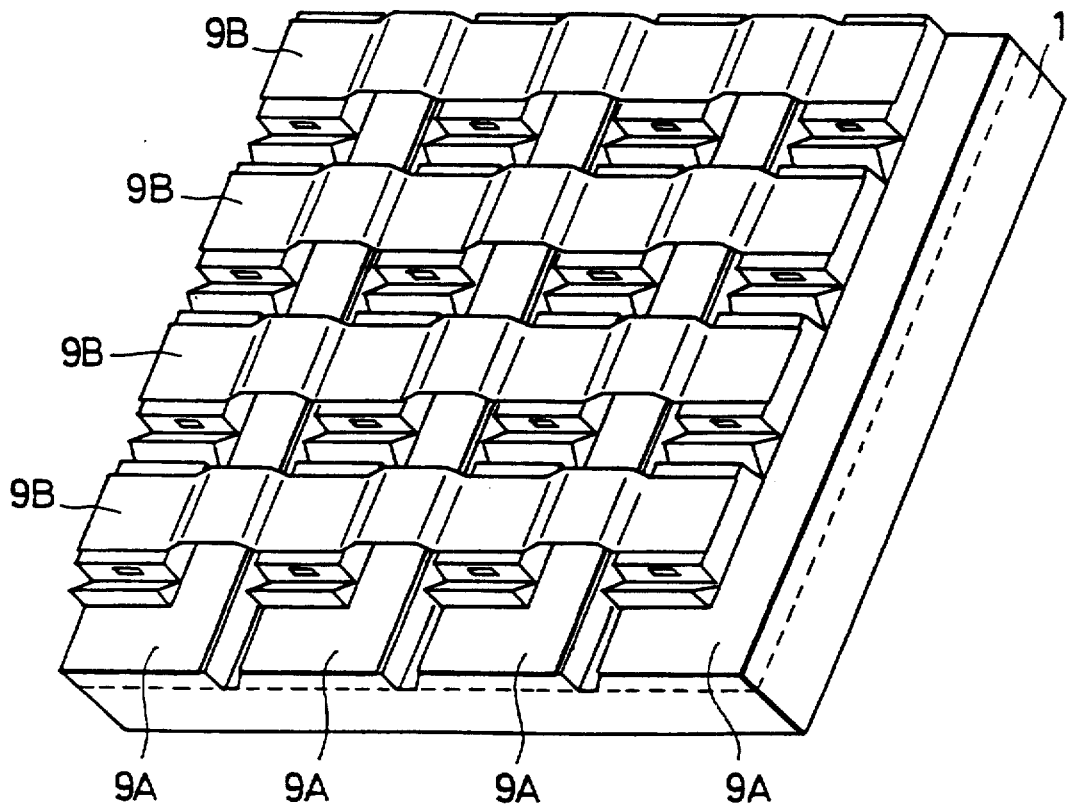
FIG. 14 is a perspective view illustrative of a two-dimensional array wiring of the semiconductor laser according to the present invention.

As shown in FIG. 14, a plurality of first electrodes 9A on the semiconductor substrate 1 and a plurality of second electrodes 9B on the laser device are formed as a double-layer structure and the first and second electrodes 9A and 9B are independently controlled in voltage so that a plurality of lasers can be controlled independently.

Figure 15:
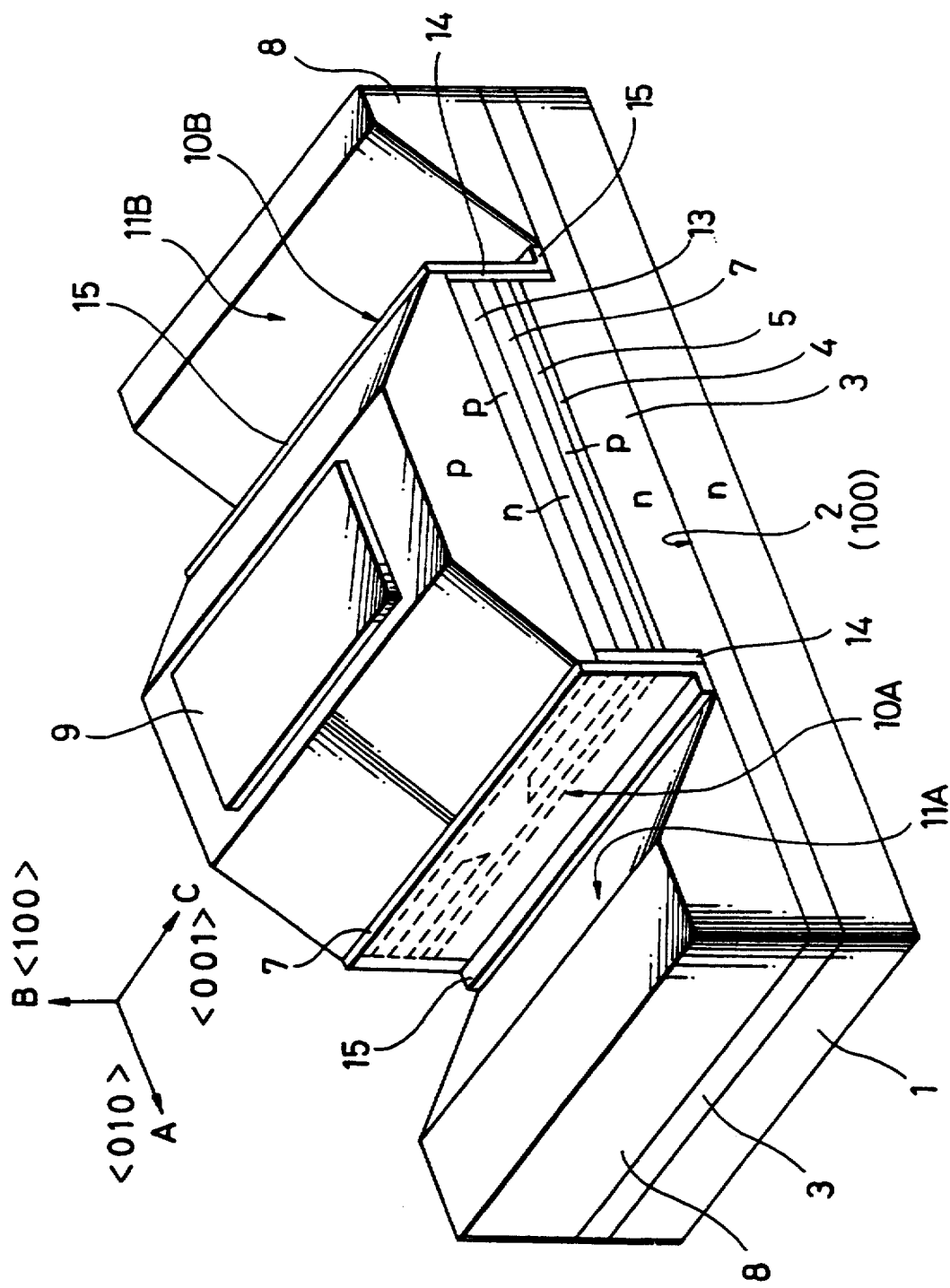
FIG. 15 is a perspective view illustrative of a fourth embodiment of the semiconductor laser device according to the present invention.

A fourth embodiment of the semiconductor laser according to the present invention will hereinafter be described with reference to FIG. 15. As shown in FIG. 15, an edge portion 15E at the base portion side of the growth blocking layer 15 is extended in the resonator length direction, i.e., in the <001> crystal axis direction shown by an arrow C and is protruded in the <010> crystal axis direction shown by an arrow A. An example of a manufacturing method of this semiconductor laser device shown in FIG. 15 will be described with reference to FIGS. 16 to 18. In FIG. 15 and FIGS. 16 to 18, like parts corresponding to those of FIG. 3 and FIGS. 7 to 9 are marked with the same references and therefore need not be described in detail.

Figure 16:
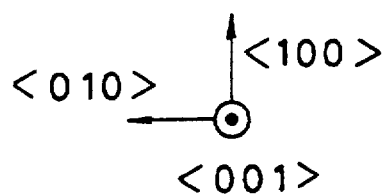
FIGS. 16 through 18 are manufacturing process diagrams of the fourth embodiment of the semiconductor laser device according to the present invention, respectively.
Figure 16:
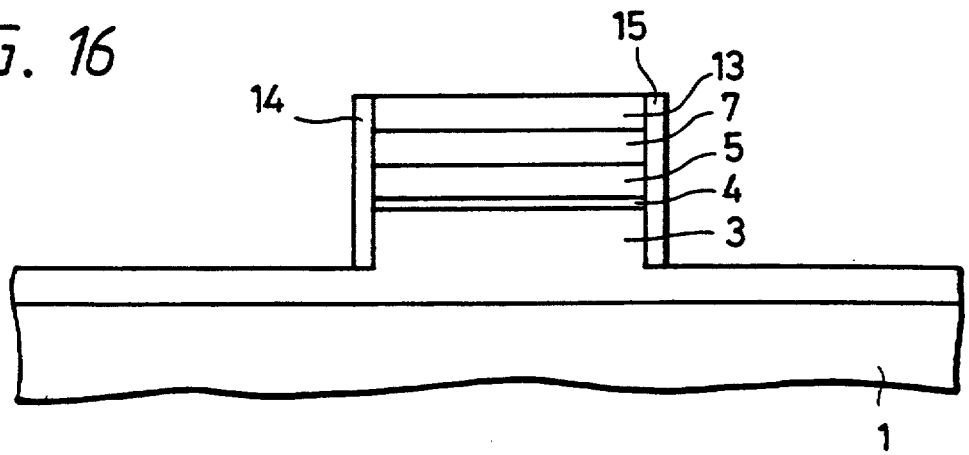
Figure 17:
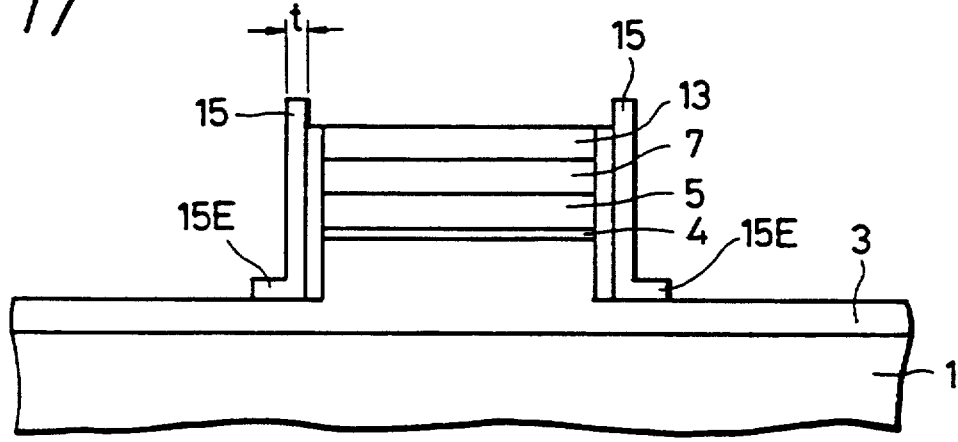
Figure 18:
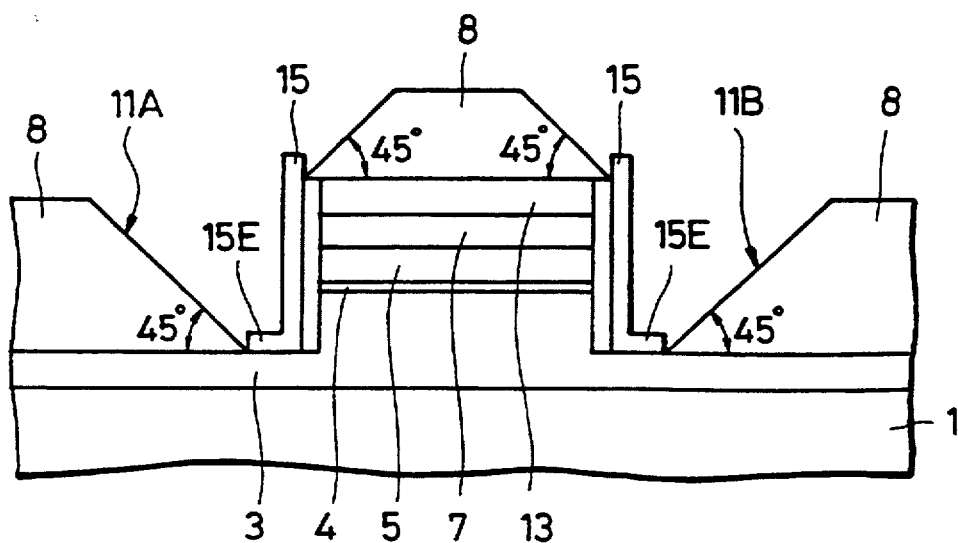

Initially, as shown in FIG. 16, the respective layers 3, 4, 5, 7, 13 and the protecting film 14 are formed on the semiconductor substrate 1 similarly to the example that was already explained with reference to the perspective view of FIG. 3 and the process diagrams of FIGS. 7 to 9. Thereafter, as shown in FIG. 17, the growth blocking layer 15 made of dielectric material such as $SiO_2$, $Si_3N_4$ or the like is formed by the patterning process so that the edge portion 15E formed at the base portion thereof is protruded in the resonator length direction. Thereafter, when the regrown layer 8 of second conductivity type is epitaxially grown, the regrown layer 8 is not grown on the growth blocking layer 15 and the regrown layer 8 is extended from the edge portion 15E of the growth blocking layer 15. In this case, the regrown layer is formed on the upper portion of the cladding layer 6 of second conductivity type so that it is extended from the edge portion of the inside of the top of the growth blocking layer 15.

The reflection mirror surfaces 11A and 11B that are crystally grown at an angle of 45° relative to the major surface 2 of the substrate 1 are much more spaced from the growth blocking layer 15 as compared with the example of FIG. 3. Therefore, a laser light reflected by the reflection mirror surfaces 11A, 11B in the direction perpendicular to the substrate 1 can be protected from divergence by the growth blocking layer 15 and hence, the surface-emission can be carried out with excellent efficiency.

Also in this case, the reflection mirror surfaces 11A and 11B are formed by the crystal growth whose planarity and angle can be controlled satisfactorily and the crystal growth conditions thereof are substantially the same as those of the ordinary semiconductor laser device. Thus, it is possible to obtain a surface-emission semiconductor laser device which is excellent in general-purpose property and handiness.

In the examples shown in FIGS. 3 and 15, the thickness of the growth blocking layer 15 is preferably selected to be about $\lambda/2$ relative to a wavelength $\lambda$ of a laser light in order to efficiently emit a laser light to the outside.

When laser beams are emitted from the respective end faces of the resonator to thereby obtain 2-bundle laser beams, a spacing between the two laser beams can be controlled arbitrarily and satisfactorily by properly selecting the resonator length, the thickness of the growth blocking layer 15, the length of edge portion 15E or the like.

Figure 19:
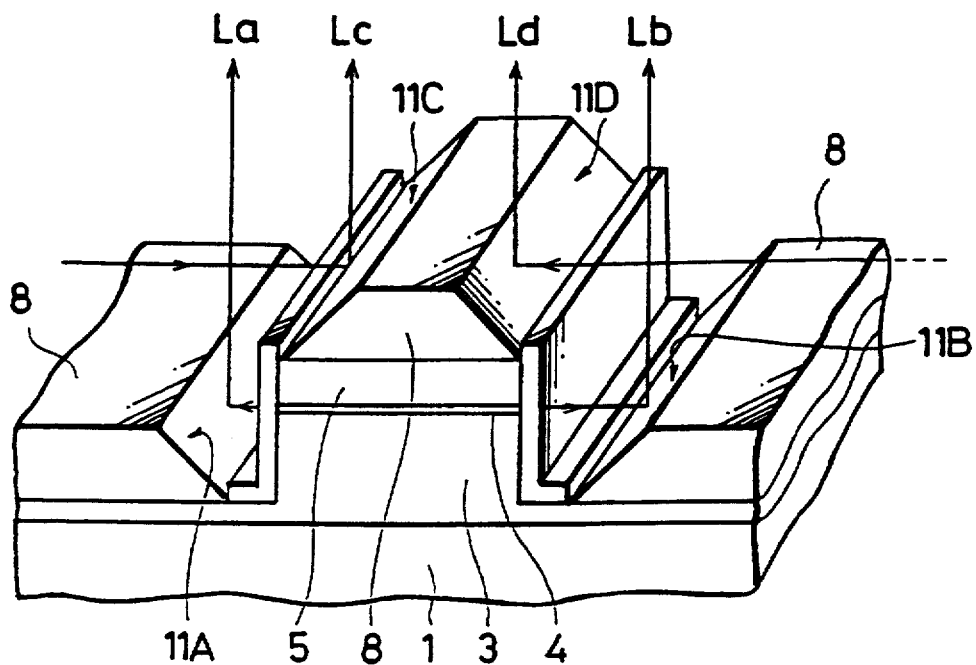
FIG. 19 is a perspective view illustrative of a fifth embodiment of the semiconductor laser device according to the present invention.

Further, in the aforesaid respective examples, the regrown layer 8 on the active layer 4 is grown while forming the {110} crystal facet at an angle of 45° relative to the substrate 1 similarly to the regrown layer 8 constructing the reflection mirror surfaces 11A, 11B. If a semiconductor laser device is extended in the <010> crystal axis direction in parallel to the major surface of the semiconductor substrate 1 and the semiconductor laser device (not shown) in which a height of an active layer is large as compared with that of the active layer 4 is formed on the same substrate as, for example, shown in FIG. 19, then laser beams of 2-light bundles can be obtained as shown by arrows La, Lb. Also, laser beams Lc and Ld from other semiconductor laser devices formed on both sides thereof can be emitted from the reflection mirror surfaces 11C and 11D formed on the active layer 4 in the vertical direction, thereby obtaining a 4-light bundle multibeam surface-emission type semiconductor laser device.

Figure 20:
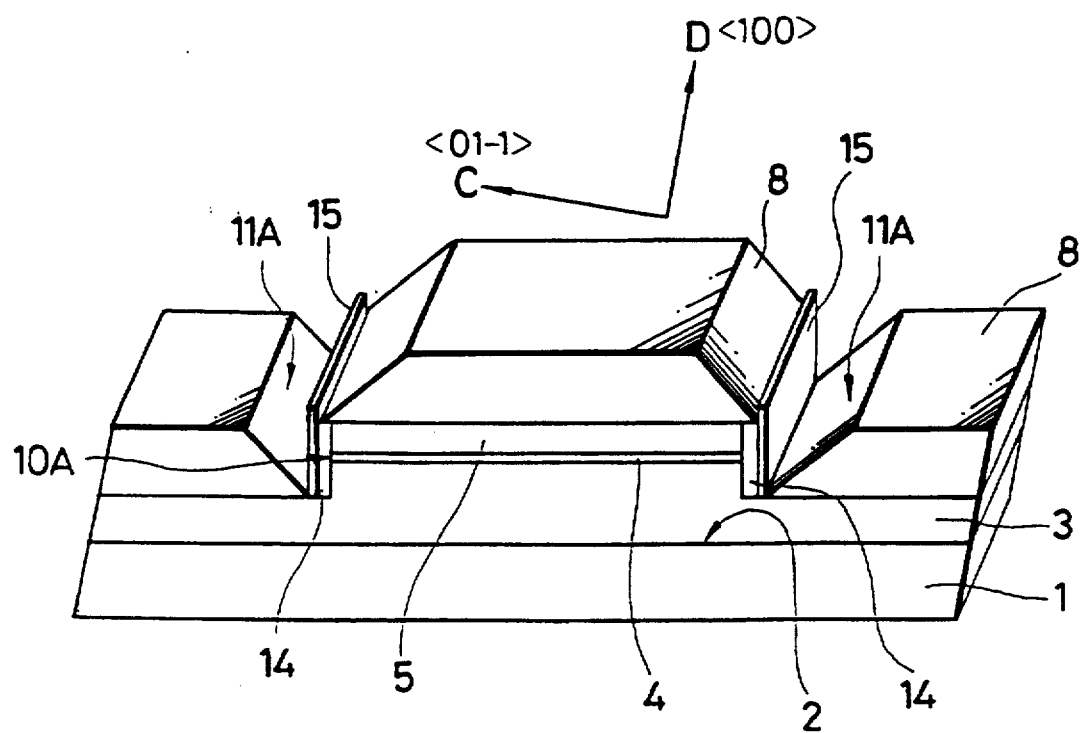
FIG. 20 is a perspective view illustrative of a sixth embodiment of the semiconductor laser device according to the present invention.

A sixth embodiment of the semiconductor laser device according to the present invention will hereinafter be described in detail with reference to FIG. 20. In FIG. 20, like parts corresponding to those of FIG. 3 are marked with the same references and therefore need not be described in detail.

Figure 1:
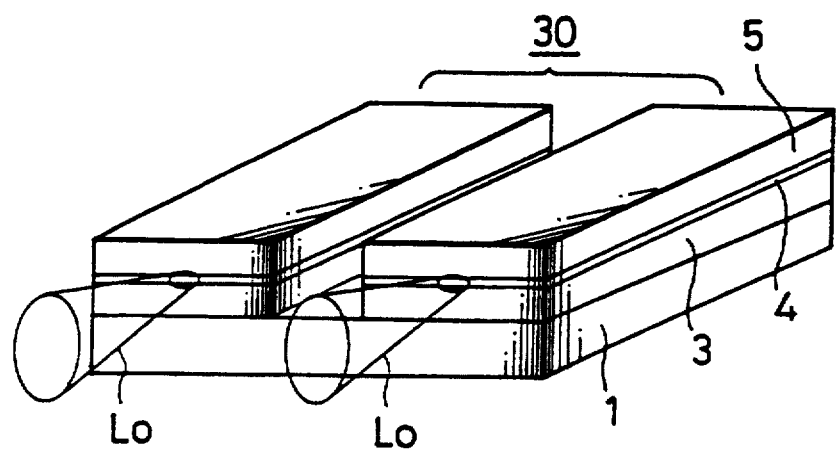
FIG. 1 is a perspective view illustrative of a conventional multibeam semiconductor laser device of horizontal light emission type.
Figure 2:
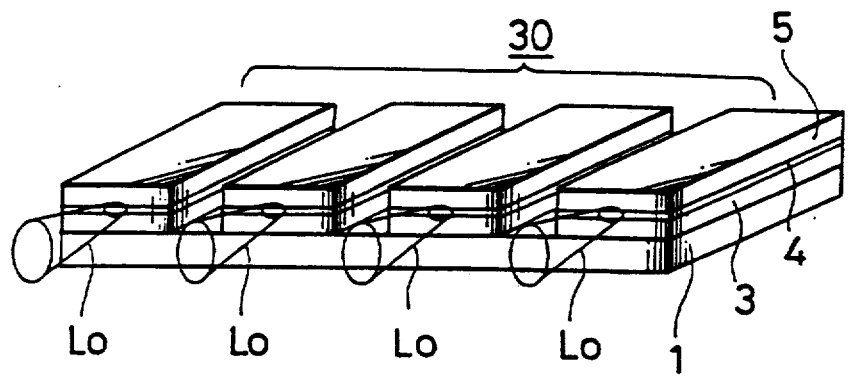
FIG. 2 is a perspective view illustrative of a conventional multibeam semiconductor laser device of horizontal light emission type.

As shown in FIG. 20, by using an off-substrate which is offset from the {100} crystal facet to the <0-11> crystal axis direction by an angle of about 9.7° as the semiconductor substrate 1 and by selecting the resonator length direction to be a direction in which the resonator length direction is offset by an angle of about 9.7° in the <100> crystal axis direction which forms an angle of 90° from the <0-11> crystal axis direction to the <100> crystal axis direction, the semiconductor device can be formed by a similar material composition and structure to those of the example shown in FIG. 1. The reflection mirror surfaces 11A and 11B are spontaneously grown as (11-1) crystal plane and (1-11) crystal plane of the crystal grown {111} B crystal plane, for example. The {111} B crystal plane forms an angle of substantially 54,7° relative to the {100} crystal plane. In this case, since the off-substrate formed at an angle of 9.7° with respect to the {100} crystal plane is utilized, the reflection mirror surfaces 11A, 11B can be formed at an angle of substantially 45° relative to the major surface 2 of the substrate 1, respectively.

Therefore, also in this case, a laser oscillation is produced by the injection of a current so that laser beams, temporarily emitted in parallel to the major surface 2 of the substrate 1, are reflected in the direction perpendicular to the substrate 1 by the reflection mirror surfaces 11A, 11B, each having an angle of 45° relative to the substrate 1, thereby realizing the surface emission.

A description will be made on the case that a first conductivity-type cladding layer, an active layer and a second conductivity-type cladding layer are epitaxially grown on a GaAs semiconductor substrate of other embodiment in that order and a crystal growth mirror surface is further formed, thereby constructing a multibeam semiconductor laser.

Figure 21:
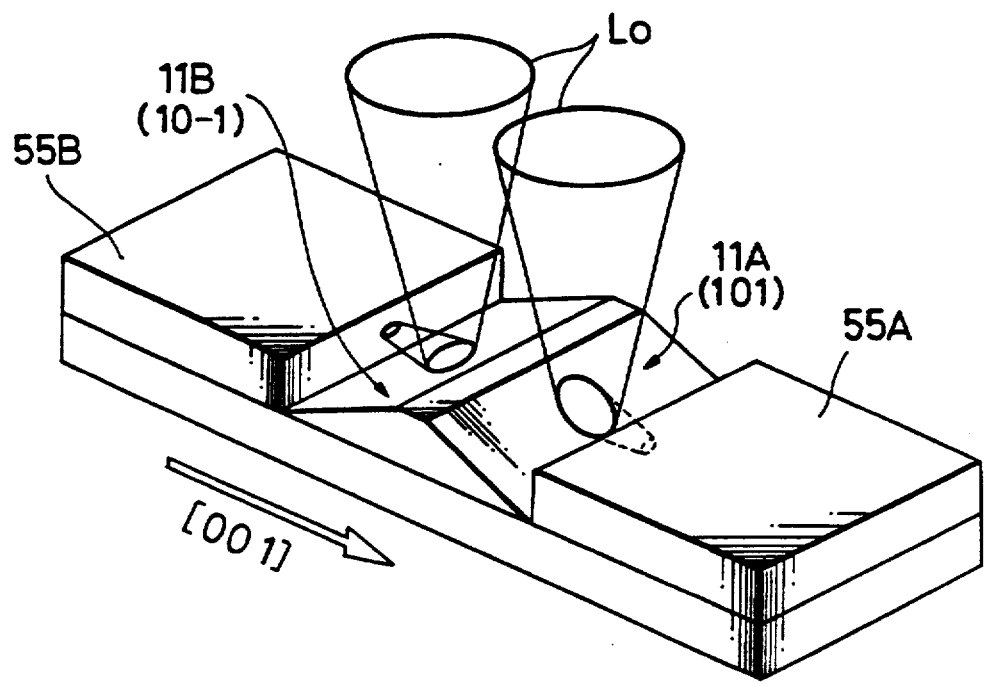
FIGS. 21 and 22 are perspective views illustrative of seventh and eighth embodiments of a multibeam semiconductor laser device according to the present invention, respectively.

An example of a multi-beam semiconductor laser having two light beams will be described with reference to FIG. 21. Referring to FIG. 21, two lasers 55A, 55B having resonators along the <001> crystal axis direction, in this case, the [001] crystal axis direction are disposed on the major surface 2 formed of the {100}0 crystal surface, e.g., (100) crystal surface of the GaAs semiconductor substrate. Then, a crystal growth reflection mirror surface 11A formed of {110} crystal surface having an angle of 45° relative to the major surface of the substrate, in this case, (101) crystal surface and a crystal growth reflection mirror surface 11B formed of a (10-1) crystal surface are formed between respective light emitting end faces in an opposing relation to the respective light emitting end faces.

According to the above-mentioned structure, a spacing between the crystal growth reflection mirror surfaces 11A and 11B can be adjusted by properly selecting the spacing between the end faces of the lasers 55A and 55B. Accordingly, a spacing between the laser beams can be narrowed without causing thermal interference of lasers.

Figure 22:
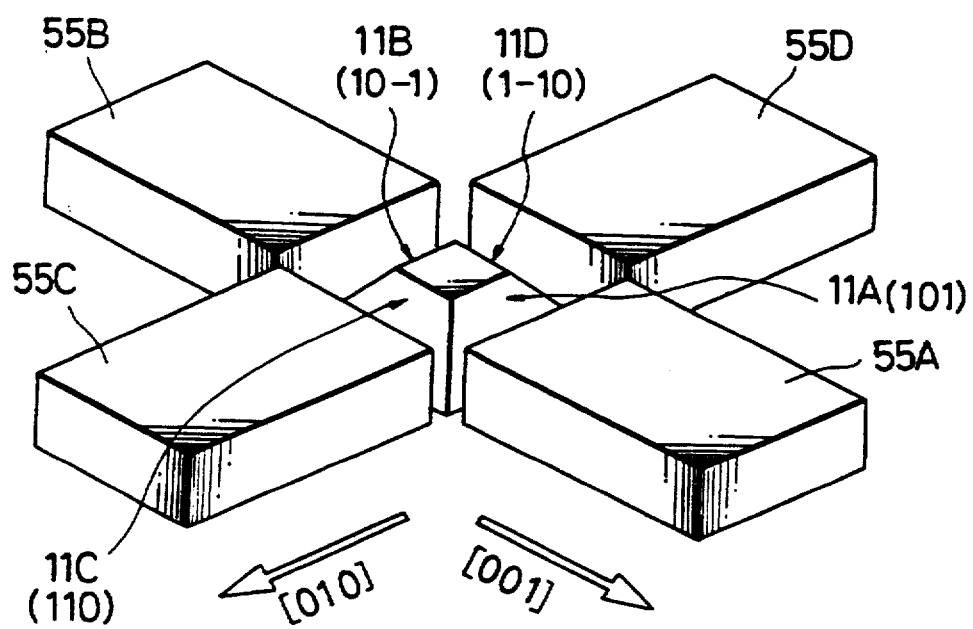

While the present invention is applied to the multibeam semiconductor laser having two light beams as described above, the present invention is not limited thereto and the following variant is also possible. That is, as shown in FIG. 22, for example, there are formed two opposing lasers 55A, 55B which are extended along the [001] crystal axis direction and two lasers 55C, 55D which are extended along [010] crystal axis direction perpendicular to the [001] crystal axis direction. Then, a crystal growth reflection mirror surface 11C formed of {110} crystal surface, e.g., (110) crystal surface and a crystal growth reflection mirror surface 11D formed of (1-10) crystal surface are spontaneously formed by the crystal regrowth similarly to the aforesaid example. Therefore, light beams from the respective lasers can be arranged in square shape in the directions perpendicular to the major surface of the substrate and then emitted.

Figure 23:
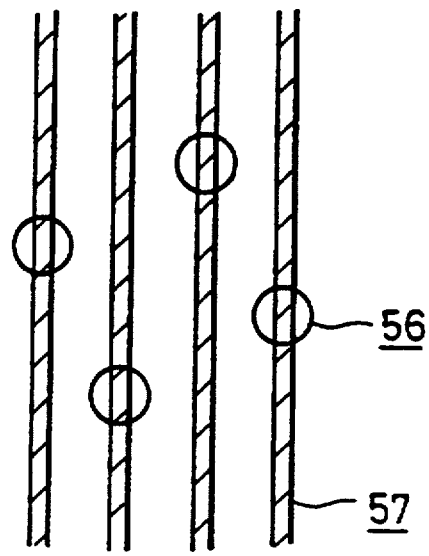
FIGS. 23 and 24 are schematic diagrams used to explain an example of the application of a 4-beam laser, respectively.

While ordinary four-beam lasers are arrayed in one row in parallel to one another, the laser beams of this embodiment are arranged in square shape. Therefore, when this laser is utilized as a light source for treating tracks of the optical disc, if the above laser is disposed so that respective beam spots 56 irradiate different tracks 57 as shown in FIG. 23, then the parallel treatment can be carried out.

Figure 24:
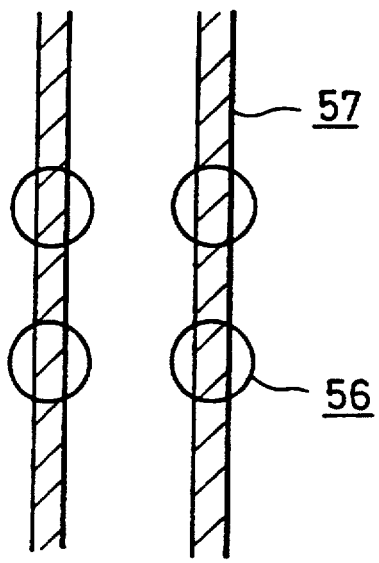

Further, if two laser spots 56 irradiate the same track 57 as shown in FIG. 24 where one laser beam per track is used as a writing laser beam and the reading is carried out by using the other laser beam immediately. Therefore, freedom in system design can be increased.

Figure 25:
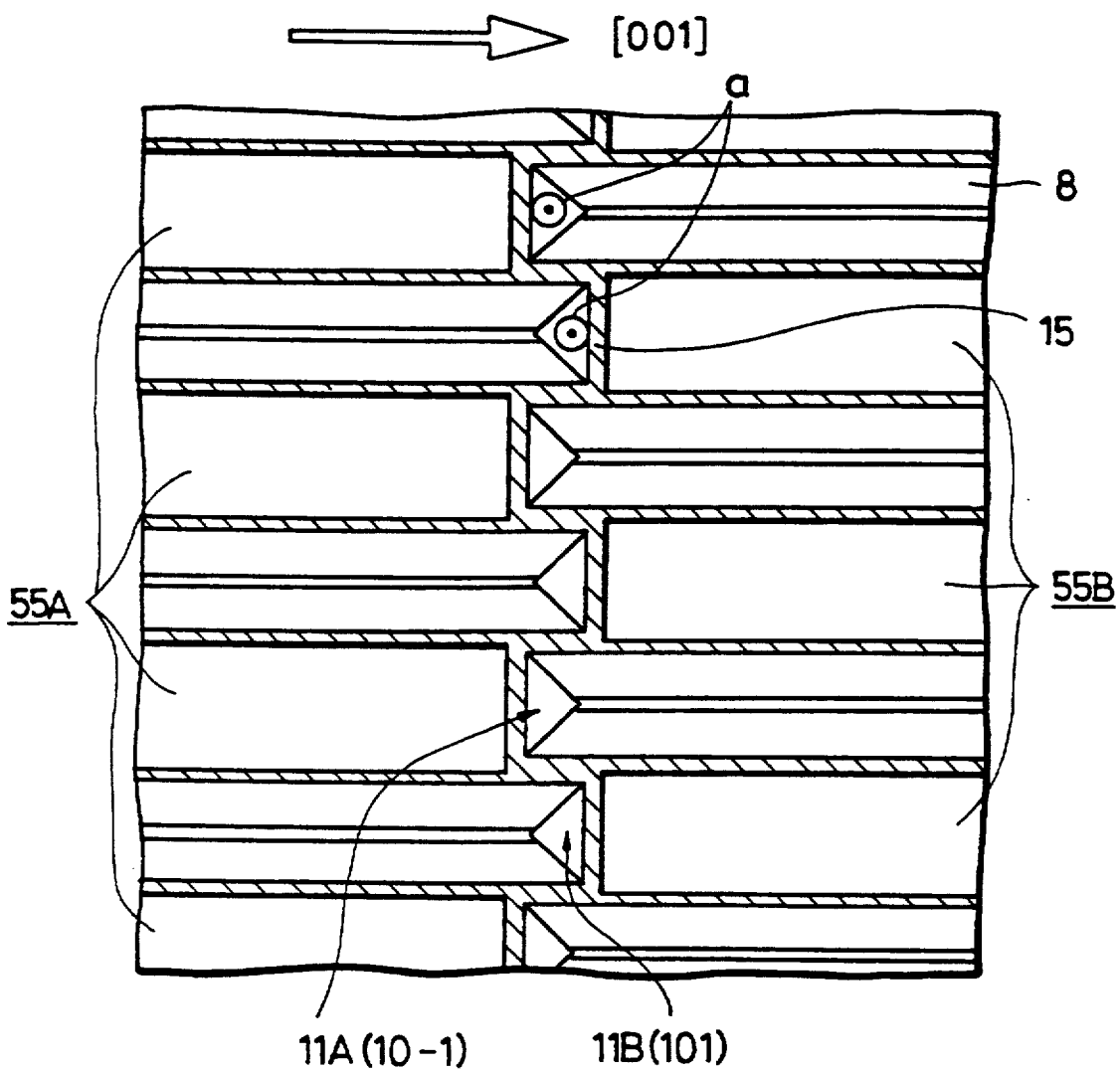
FIG. 25 is a plan view illustrative of a ninth embodiment of the multibeam semiconductor laser according to the present invention.

A further embodiment of the present invention will hereinafter be described with reference to FIG. 25. In FIG. 25, like parts corresponding to those of FIGS. 20 and 21 are marked with the same references and therefore need not be described. In this case, a plurality of lasers 55A, each of which emits a light beam at least in a first direction along the <001> crystal axis direction, in this case, [001] crystal axis direction and a plurality of lasers 55B, each of which emits a light beam in the [00-1] direction which is opposite to the above-mentioned first direction are formed on a major surface of the semiconductor substrate whose major surface is {100} crystal surface. Also, crystal growth reflection mirror surfaces 11A, 11B formed of {110} crystal surfaces having an angle of 45° relative to the major surface of the substrate are disposed in an opposing relation to the light emitting end faces of these lasers 55A, 55B.

That is, in this case, a plurality of one side light emitting portions of the semiconductor lasers shown in FIGS. 21 and 22 are arrayed in parallel to one another, and lasers are similarly arrayed at the positions corresponding to the spaces between the lasers in parallel to one another, whereby pseudo-light emitting points emitted from one end faces of the respective lasers and reflected on the mirror surfaces are arranged on a straight line. In this case, a one-dimensional laser array can be obtained by alternately disposing resonator bodies in a zigzag fashion. At that time, the other end faces of the respective lasers are coated with high-reflection coating layers so as to prevent light beams from being emitted. Alternatively, by a cleavage facet or etching treatment or the like, light beams can be prevented from being emitted in the direction perpendicular to the substrate.

Figure 26:
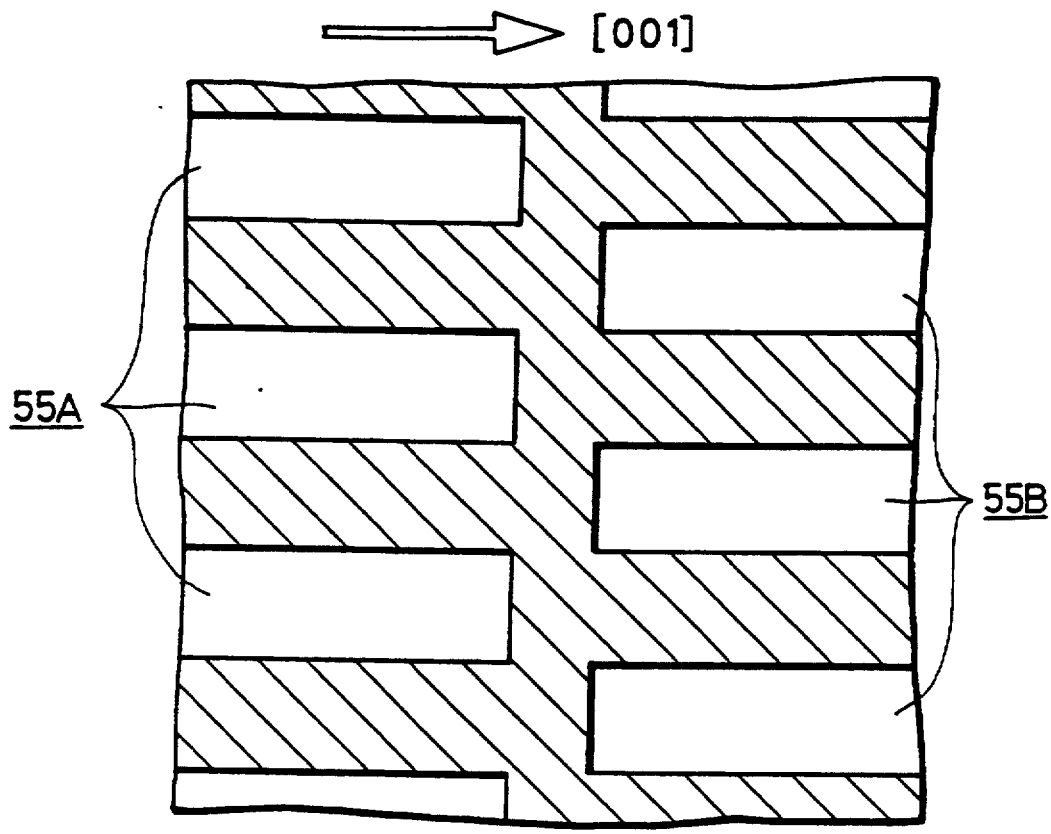
FIG. 26 is a process diagram showing the ninth embodiment of the multibeam semiconductor laser according to the present invention.

A manufacturing method of such semiconductor laser will be described below. A first conductivity type cladding layer made of n-type AlGaAs or the like, an active layer made of GaAs or the like, a second conductivity type cladding layer made of p-type AlGaAs or the like, a capping layer or the like are epitaxially grown on the major surface formed of {100} crystal surface of a semiconductor substrate made of n-type GaAs or the like, for example, in that order. Thereafter, as shown in a manufacturing process diagram of FIG. 26, end faces and side faces of resonators are vertically etched by the RIE process or the like so that respective resonators are disposed in a zigzag fashion. Then, hatched regions in FIG. 25 are removed by the etching process.

Then, a dielectric layer is deposited on the whole surface and a dielectric protecting layer 8 is formed by a patterning process so as to cover alternately-opposing end faces and side faces of the respective resonators. In FIG. 25, the portions on which the dielectric protecting layers 8 are provided are shown hatched. Thereafter, if layers are epitaxially grown by an MOCVD method or the like, then the crystal growth reflection mirror surface 11A formed of (10-1) crystal surface is formed on each end face of the laser 55A which emits a light beam in the (001) crystal axis direction and a crystal growth reflection mirror surface 11B formed of (101) crystal surface is formed on each end face of the laser 55B which emits a light beam in (00-1) crystal axis direction spontaneously. Consequently, light beams can be respectively emitted in the direction perpendicular to the sheet of drawing of FIG. 25 as shown by arrows a.

In this case, if the spacing in the resonator length direction between the end faces of the respective lasers 55A, 55B and the thickness of the dielectric protecting layer 8 on each light emitting end face or the like are properly selected, then positions reflected by the respective mirror surfaces, i.e., light emitting points are arrayed on a straight line, thereby forming a one-dimensional array laser. If the lateral direction spacing between the lasers, i.e., spacing between lasers arrayed in the direction perpendicular to the longitudinal direction of resonator is selected to be 50 82 m, then a spacing between the laser lights can be reduced to ½, i.e., 25 82 m, Therefore, as compared with the conventional multi-beam semiconductor laser, the spacing between the light beams can be reduced to about ½ without causing thermal interference.

For other use and purpose, various modifications such as to change of the number of lasers or to dispose the light emitting points in a zigzag fashion or the like may be possible.

Figure 27:
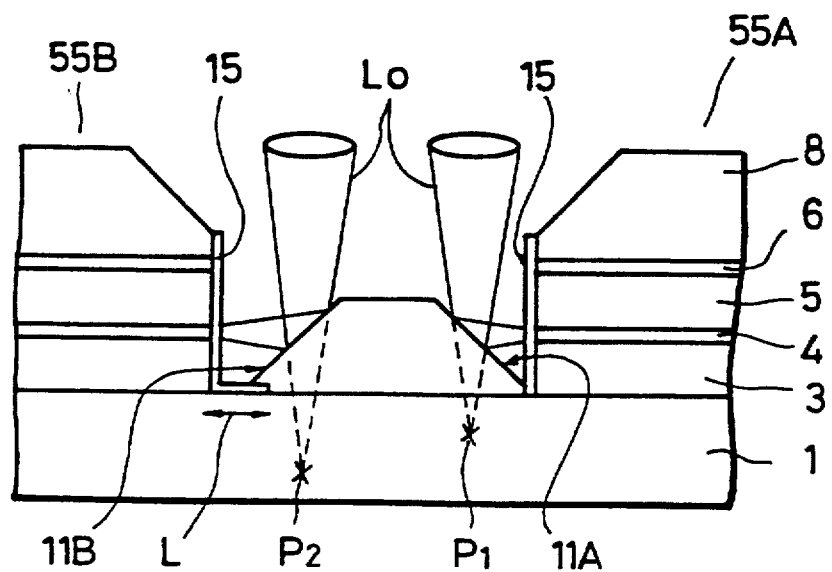
FIG. 27 is a cross-sectional view illustrative of the ninth embodiment of the multibeam semiconductor laser according to the present invention.

In the above-mentioned multi-beam semiconductor laser, a spacing between each light emitting end face and the crystal growth mirror surface can be modulated at every laser and then provided. An example of such multi-beam semiconductor laser will be described with reference to FIG. 27. In FIG. 27, like parts corresponding to those of FIG. 21 are marked with the same references and therefore need not be described in detail. In the laser having two light beams described in connection with FIG. 21, if the spacing between the light emitting end face and the reflection mirror surfaces 11A, 11B is provided as an offset formed at the base side edge portion of the dielectric protecting layer 8, for example, the dielectric protecting layer 8 is formed by the patterning process as a pattern of a protruded portion having a length L opposed to one mirror surface 11B, then focus positions of output lights L0 from the lasers 55A, 55B are different in depth as shown by points P1, P2 in FIG. 27. In this case, the focal length is increased at the laser 55B side in which the protruded portion is provided.

The two-beam semiconductor laser apparatus in which the focal length is modulated can be employed in a servo control system that utilizes a difference between the focal lengths of the two beams. In FIGS. 28A to 28K, circles represent beam spot diameters, respectively. Left and right columns in FIGS. 28A through 28K correspond to beam spots from the respective lasers 55A, 55B, respectively. In the examples shown in FIGS. 28A and 28B, a light intensity of a detecting element 58 is detected by the laser 55A and a light intensity of the laser 55B becomes substantially zero. In FIG. 28C, although a light intensity of the laser 55A is increased and a light intensity of the laser 55B is detected, a light intensity of the laser 55A is increased. Although the light intensity of the laser 55A becomes large similarly in FIGS. 28D and 28E, the light intensities of the lasers 55A and 55B become substantially equal in the example of FIG. 28F. Conversely, in FIGS. 28G to 28E, the light intensity of the laser 55B is increased and a light intensity difference therebetween is increased progressively. In FIGS. 28J and 28K, the beam spot diameter of the laser 55A is further increased and a light intensity thereof becomes substantially zero.

Therefore, by the controlling the focal length so that the state shown in FIG. 28F is presented, i.e., a light intensity difference becomes zero, a controlled object can be held at a constant distance and the focusing servo control can be effected.

While the AlGaAs laser is formed as described above, the present invention is not limited thereto and may be applied to other compound semiconductor lasers such as an AlGaInP semiconductor laser, an InGaAsP semiconductor laser or the like. Furthermore, the structure of the semiconductor laser is not limited to those of the above-mentioned examples and various modifications and variations could be effected therein.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A light emitting element comprising:
   a semiconductor substrate having {100} crystal surface as a major surface;
   a light emitting element formed on said semiconductor substrate;

a growth blocking layer formed on a resonator end face of said light emitting element;

a regrown layer formed on said light emitting element;

a reflection mirror opposed to said resonator end face;

a first electrode in contact with said semiconductor substrate; and a second electrode formed on said regrown layer, wherein said regrown layer is made of the same material as that of said reflection mirror and said reflection mirror is formed of a semiconductor formed of {110} crystal surface epitaxially grown.

2. A light emitting element comprising:

a semiconductor substrate having {100} crystal surface as a major surface;

a light emitting element formed on said semiconductor substrate having a plurality of resonators whose directions are parallel to <001> direction;

a reflection mirror opposed to said resonator end face;

a first electrode in contact with said semiconductor substrate; and a second electrode formed on said light emitting element, wherein said reflection mirror is formed of a semiconductor formed of {110} crystal surface epitaxially grown.

3. A light emitting element comprising:

a semiconductor substrate having {100} crystal surface as a major surface;

a light emitting element formed on said semiconductor substrate having a plurality of resonators whose directions are parallel to <001> direction;

a growth blocking layer formed on said resonator end face;

a regrown layer formed on said light emitting element;

a reflection mirror opposed to aid resonator end face;

a first electrode in contact with said semiconductor substrate; and a second electrode formed on said light emitting element, wherein said reflection mirror is formed of a semiconductor formed of {110} crystal surface epitaxially grown.

4. A light emitting element comprising:

a semiconductor substrate having a surface inclined about 9.7° from {100} crystal surface to <0-11> crystal axis direction as a major surface;

a plurality of light emitting elements formed on said semiconductor substrate;

a growth blocking layer formed on said resonator end face;

a regrowth layer formed on said light emitting element;

a reflection mirror opposed to said resonator end face;

a first electrode in contact with said semiconductor substrate; and a second electrode formed on said light emitting element, wherein said reflection mirror is formed of a semiconductor formed of {111}B crystal surface epitaxially grown.

5. The light emitting element according to claim 4, wherein said resonator direction is inclined about 9.7° from <0-11> direction to a <100> direction.

6. The light emitting element according to any one of claims 2, 3 and 4, wherein said light emitting element and said reflection mirror are disposed alternately and a light emitted from said light emitting element is emitted along a straight line.

7. The light emitting element according to any one of claims 2, 3, and 4, wherein said light emitting element is integrated in a two-dimensional fashion.

8. The light emitting element according to claim 7, wherein said first electrode is formed of a plurality of straight line electrodes.

9. The light emitting element according to claim 8, wherein said second electrode is formed of a plurality of straight line electrodes.

10. The light emitting element according to claim 9, wherein said first and second electrodes cross each other.

* * * * *